(12) United States Patent
Yen et al.

(10) Patent No.: US 11,715,782 B2
(45) Date of Patent: Aug. 1, 2023

(54) METHOD FOR MANUFACTURING THREE-DIMENSIONAL SEMICONDUCTOR DIODE DEVICE

(71) Applicant: TAIWAN CARBON NANO TECHNOLOGY CORPORATION, Miaoli County (TW)

(72) Inventors: Tsung-Fu Yen, Miaoli County (TW); Kuang-Jui Chang, Miaoli County (TW); Chun-Hsien Tsai, Miaoli County (TW); Ting-Chuan Lee, Miaoli County (TW); Chun-Jung Tsai, Miaoli County (TW)

(73) Assignee: TAIWAN CARBON NANO TECHNOLOGY CORPORATION, Miaoli County (TW)

( * ) Notice: Subject to any disclaimer, the term of this patent is extended or adjusted under 35 U.S.C. 154(b) by 84 days.

(21) Appl. No.: 17/513,321

(22) Filed: Oct. 28, 2021

(65) Prior Publication Data
US 2022/0140106 A1    May 5, 2022

(30) Foreign Application Priority Data
Oct. 30, 2020    (TW) ................ 109137872

(51) Int. Cl.
*H01L 29/66* (2006.01)
*H01L 29/861* (2006.01)
*H01L 29/267* (2006.01)

(52) U.S. Cl.
CPC ........ *H01L 29/6609* (2013.01); *H01L 29/861* (2013.01); *H01L 29/267* (2013.01)

(58) Field of Classification Search
CPC ..... H01L 2924/12036; H01L 29/66136; H01L 2924/12031; H01L 29/868; H01L 27/0766;
(Continued)

(56) References Cited

U.S. PATENT DOCUMENTS

| 2009/0242910 A1* | 10/2009 | Murofushi | ............. H01L 24/05 257/E33.012 |
| 2010/0157680 A1* | 6/2010 | Higuchi | ........... H01L 29/40117 257/E21.21 |

(Continued)

*Primary Examiner* — Shahed Ahmed
(74) *Attorney, Agent, or Firm* — Muncy, Geissler, Olds & Lowe, P.C.

(57) ABSTRACT

A method for manufacturing a three-dimensional semiconductor diode device comprises providing a substrate comprising a silicon substrate and a first oxide layer formed on the silicon substrate; depositing a plurality of stacked structures on the substrate, each of the stacked structures comprising a dielectric layer and a conductive layer; etching the stacked structures through a photoresist layer which is patterned to form at least one trench in the stacked structures, a bottom of the trench exposing the first oxide layer; depositing a second oxide layer on the stacked structures and the trench; depositing a high-resistance layer on the second oxide layer, the high-resistance layer comprising a first polycrystalline silicon layer and a first conductive compound layer; and depositing a low-resistance layer on the high-resistance layer, the low-resistance layer comprising a second polycrystalline silicon layer and a second conductive compound layer.

15 Claims, 6 Drawing Sheets

(58) Field of Classification Search
CPC ............ H01L 51/0579; H01L 29/6609; H01L 29/861; H01L 29/267; H01L 29/945; H01L 29/66196
See application file for complete search history.

(56) References Cited

U.S. PATENT DOCUMENTS

| | | | |
|---|---|---|---|
| 2017/0263710 A1* | 9/2017 | Matsumoto | H01L 29/1058 |
| 2020/0105595 A1* | 4/2020 | Sharangpani | H01L 27/11582 |

* cited by examiner

METHOD FOR MANUFACTURING THREE-DIMENSIONAL SEMICONDUCTOR DIODE DEVICE

FIELD OF THE INVENTION

The invention relates to a method for manufacturing semiconductors, and more particularly to a method for manufacturing a three-dimensional semiconductor diode device.

BACKGROUND OF THE INVENTION

The semiconductor industry is constantly developing vigorously. Technological advances in semiconductor design and materials have allowed semiconductor devices to have smaller and more complex circuits. The functional density of semiconductor devices generally increases and the size decreases, which can improve production efficiency and reduce costs.

The function of semiconductor devices is limited by the area of semiconductor chip. With the development of semiconductor technology, more and more devices adopt three-dimensional stacking technology to increase the density of components. However, the three-dimensional stacking technology increases the complexity of the semiconductor device manufacturing process, makes it more difficult to maintain the quality and stability of the semiconductor device manufacturing process, and affects the yield. The semiconductor chip of three-dimensional integrated circuit has high requirements on the structure and manufacturing process. The existing three-dimensional semiconductor manufacturing process still has many problems, which affect the electrical and mechanical properties of the semiconductor chip. Therefore, corresponding development in the manufacturing process of semiconductor devices to improve the quality and stability of the manufacturing process is an urgent problem to be solved.

SUMMARY OF THE INVENTION

The invention provides a method for manufacturing a three-dimensional semiconductor diode device capable of improving the quality and stability of the three-dimensional semiconductor diode device.

The method for manufacturing the three-dimensional semiconductor diode device of the invention comprising: providing a substrate, the substrate comprising a silicon substrate and a first oxide layer, the first oxide layer being formed on the silicon substrate; depositing a plurality of stacked structures on the substrate, each of the stacked structures comprising a dielectric layer and a conductive layer; etching the stacked structures through a photoresist layer which is patterned to form at least one trench in the stacked structures, a bottom of the at least one trench exposing the first oxide layer; depositing a second oxide layer on the stacked structures and the at least one trench; depositing a high-resistance layer on the second oxide layer, the high-resistance layer comprising a first polycrystalline silicon layer and a first conductive compound layer; and depositing a low-resistance layer on the high-resistance layer, the low-resistance layer comprising a second polycrystalline silicon layer and a second conductive compound layer, wherein a thickness of the second polycrystalline silicon layer is greater than a thickness of the first polycrystalline silicon layer, and a thickness of the second conductive compound layer is greater than a thickness of the first conductive compound layer.

The three-dimensional semiconductor diode device of the invention comprises a substrate, a plurality of stacked structures, a second oxide layer, a high-resistance layer, and a low-resistance layer. The substrate comprises a silicon substrate and a first oxide layer, and the first oxide layer is formed on the silicon substrate. A plurality of patterned stacked structures are formed on the substrate, each of the stacked structures comprises a dielectric layer and a conductive layer, the stacked structures comprise at least one trench, and a bottom of the at least one trench exposes the first oxide layer. The second oxide layer is formed on the stacked structures and the at least one trench. The high-resistance layer is formed on the second oxide layer, and the high-resistance layer comprises a first polycrystalline silicon layer and a first conductive compound layer. The low-resistance layer is formed on the high-resistance layer, the low-resistance layer comprises a second polycrystalline silicon layer and a second conductive compound layer, wherein a thickness of the second polycrystalline silicon layer is greater than a thickness of the first polycrystalline silicon layer, and a thickness of the second conductive compound layer is greater than a thickness of the first conductive compound layer.

Based on the above, the three-dimensional semiconductor diode device and the manufacturing method thereof provided by the invention are capable of greatly improving the quality and stability of the three-dimensional semiconductor diode device by disposing the stacked structures, the second oxide layer, the high-resistance layer and the low-resistance layer.

DETAILED DESCRIPTION OF THE PREFERRED EMBODIMENTS

The directional terms mentioned in the following embodiments, for example: up, down, above, below, left, right, front or back, etc., are merely directions for referring to the attached drawings. Therefore, the directional terms are used to illustrate rather than limit the invention. In this specification, the terms "about", "approximately" and "substantially" usually mean within +/−20% of a given value, more usually within +/−10% of a given value, more usually within +/−5% of a given value, more usually within 3% of a given value, more usually within +/−2% of a given value, more usually within +/−1% of a given value, or even more usually within +/−0.5% of a given value. The numerical values given in this disclosure are approximate numerical values, that is, the given value can still imply the meaning of "about" or "substantially" without specifying "about" or "substantially".

Figure 3:
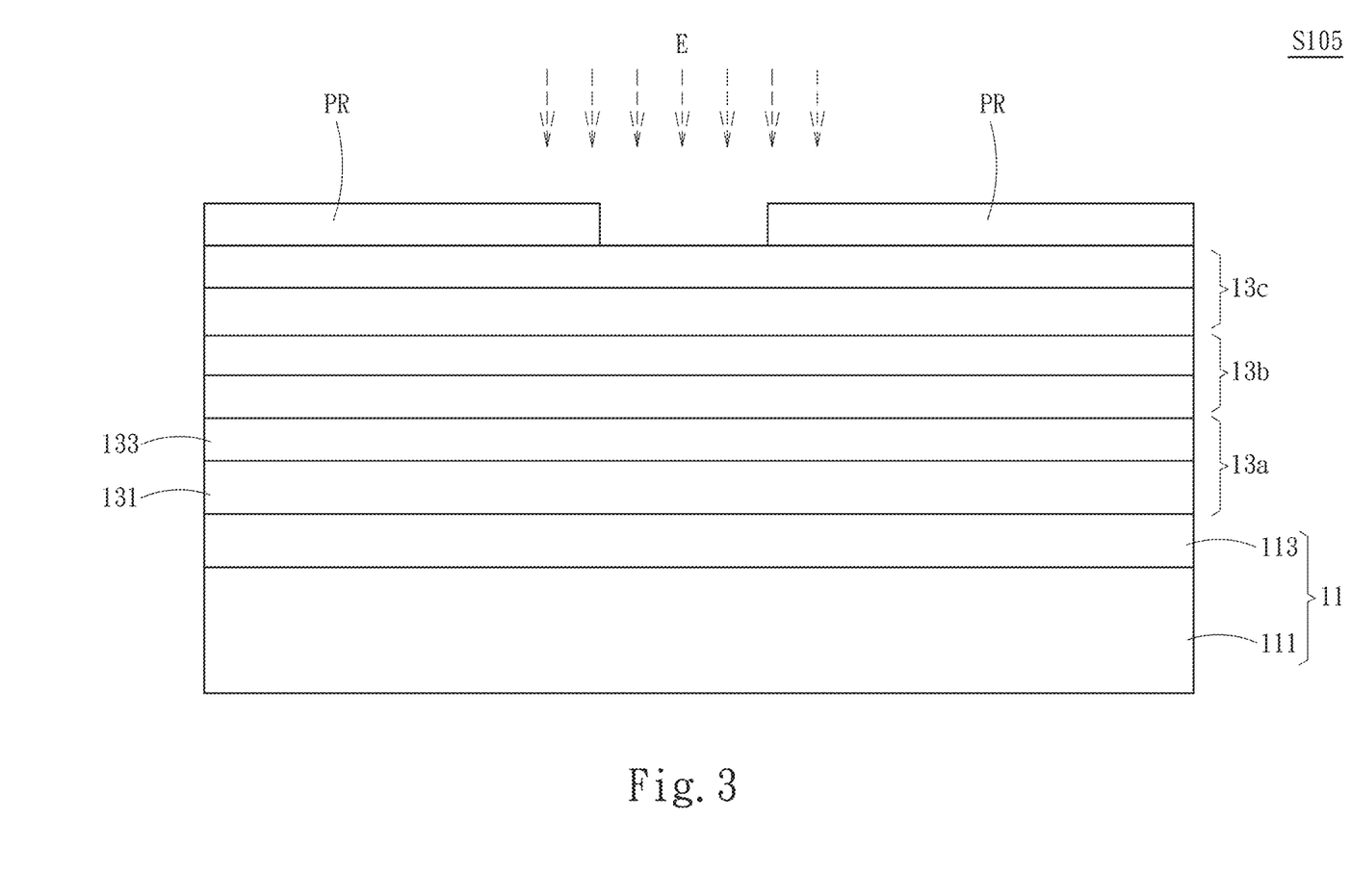
Figure 4:
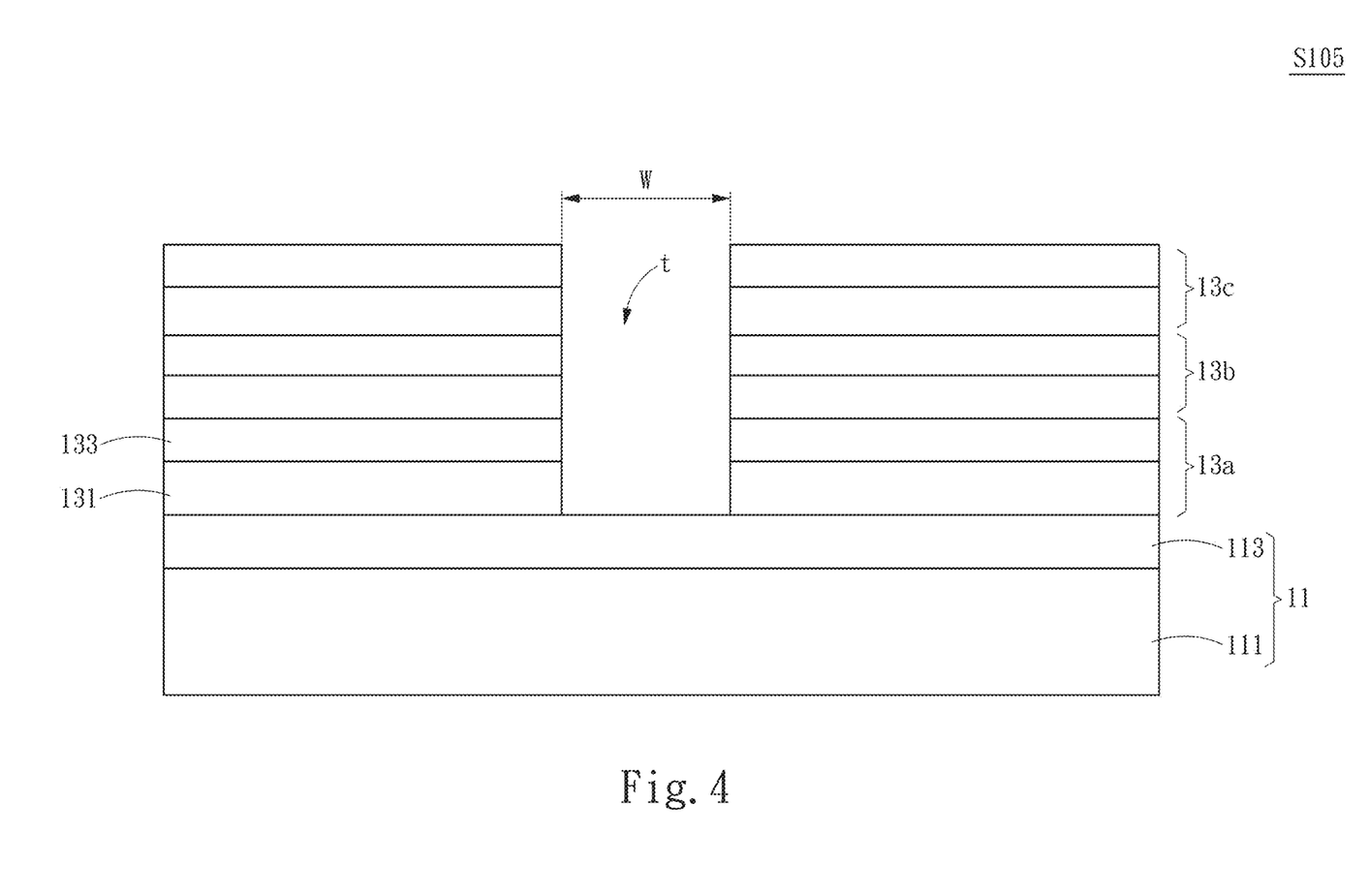
Figure 5:
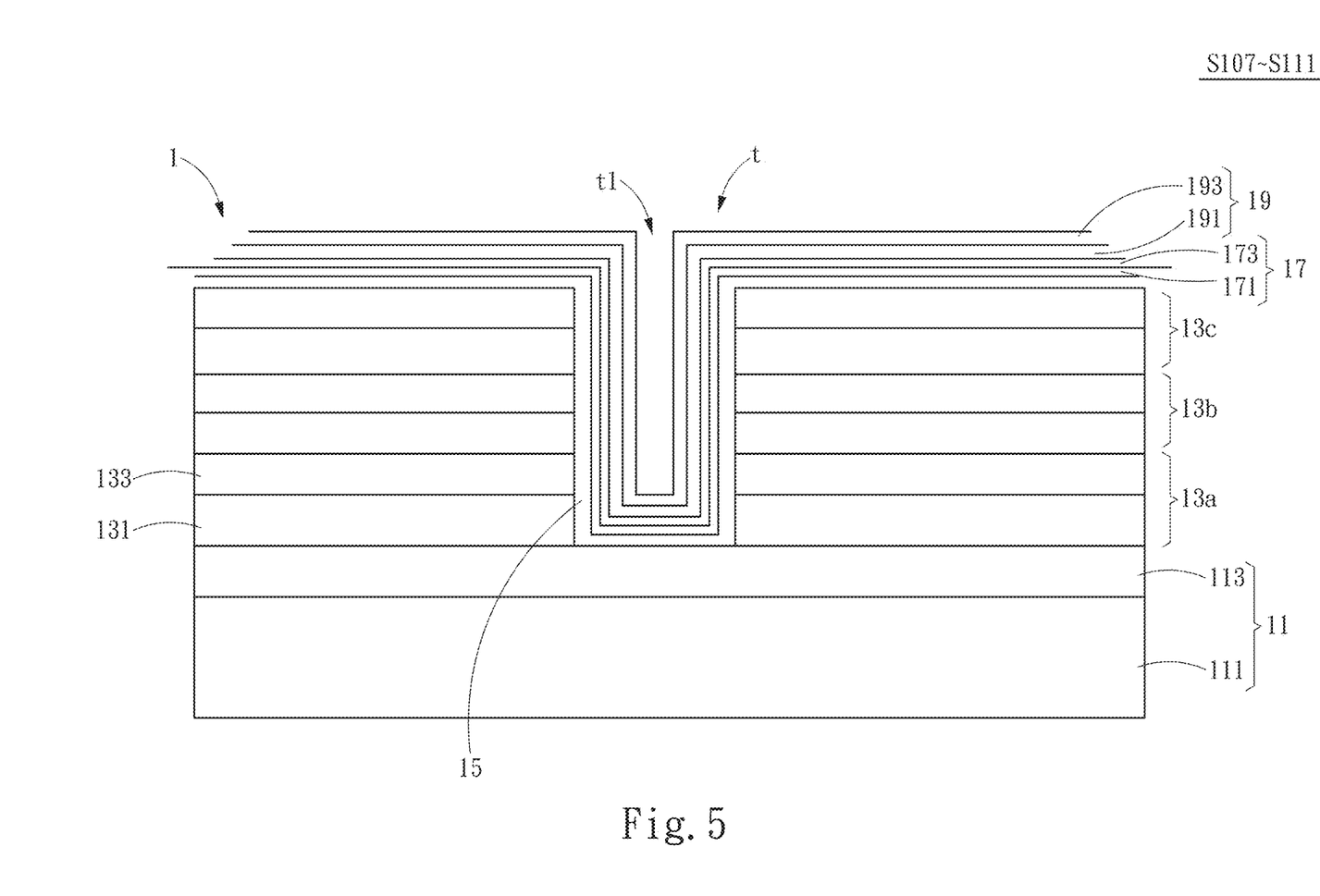
FIG. 5 is a schematic diagram of the three-dimensional semiconductor diode device according to one embodiment of the invention.

FIG. 1, FIG. 2, FIG. 3, and FIG. 4 are cross-sectional views illustrating intermediate stages of a manufacturing process of a three-dimensional semiconductor diode device 1 according to some embodiments; and FIG. 5 is a schematic diagram of the three-dimensional semiconductor diode device 1 according to one embodiment of the invention.

Figure 1:
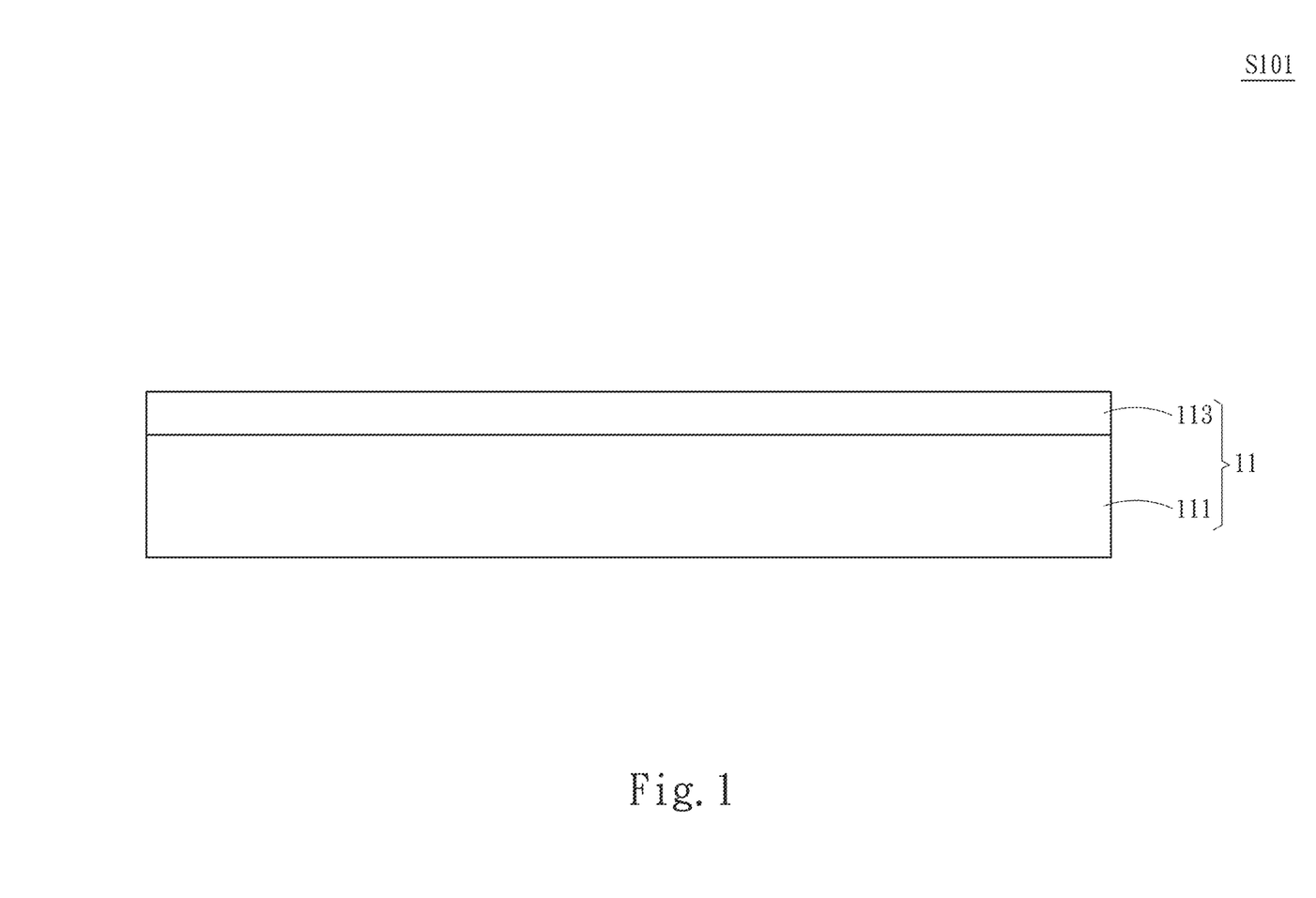
FIGS. 1, 2, 3, and 4 are cross-sectional views illustrating intermediate stages of a manufacturing process of a three-dimensional semiconductor diode device according to some embodiments.

Step S101, a substrate 11 is provided as shown in FIG. 1. The substrate 11 comprises a silicon substrate 111 and a first oxide layer 113. The first oxide layer 113 is formed on the silicon substrate 111.

Figure 2:
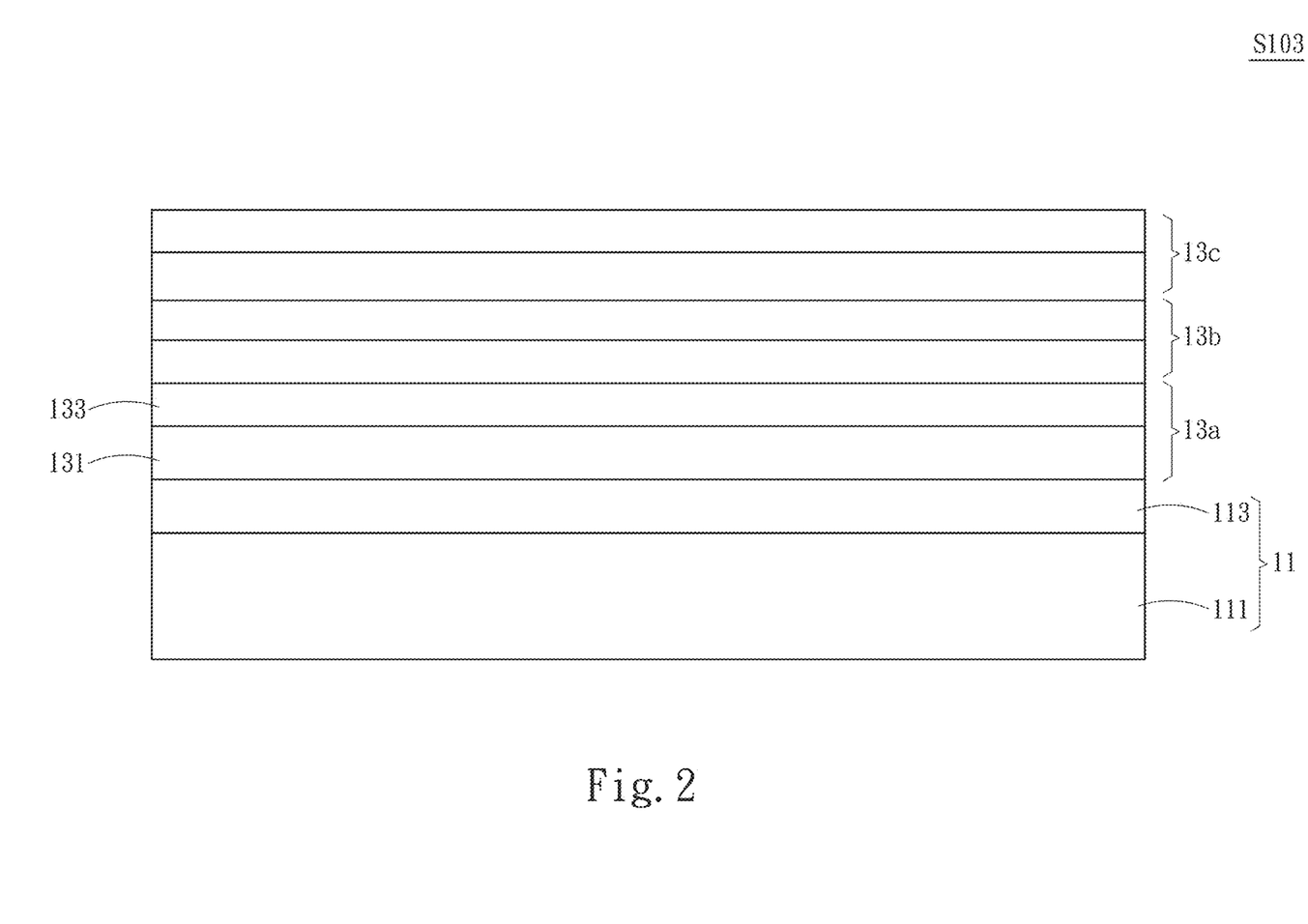

Step S103, a plurality of stacked structures 13a, 13b, 13c are deposited on the substrate 11 as shown in FIG. 2. Each of the stacked structures 13a, 13b, 13c comprises a dielectric layer and a conductive layer, wherein one of the stacked structure 13a comprising a dielectric layer 133 and a conductive layer 131 in FIG. 2 is used as an illustration, but the invention does not limit a quantity of the stacked structures 13a, 13b, 13c. In this embodiment, in one of the stacked structures 13a, 13b, 13c, the dielectric layer 133 is formed on the conductive layer 131, but the invention is not limited thereto. In other embodiments of the invention, the conductive layer 131 is formed on the dielectric layer 133 among one of the stacked structures 13a, 13b, 13c.

In one embodiment of the invention, a number of the stacked structures 13a, 13b, 13c of the three-dimensional semiconductor diode device 1 is greater than twenty. In each of the stacked structures 13a, 13b, 13c, the dielectric layer 133 is formed on the conductive layer 131, or the conductive layer 131 is formed on the dielectric layer 133.

Step S105, an etching process E is performed to etch the stacked structures 13a, 13b, 13c through a photoresist layer PR which is patterned as shown in FIG. 3. Step S105, at least one trench t is formed in the stacked structures 13a, 13b, 13c as shown in FIG. 4. A bottom of the at least one trench t exposes the first oxide layer 113. For convenience of description, the at least one trench t is used as an example for illustration in FIG. 4, but the invention does not limit a quantity of trench t.

Step S107, a second oxide layer 15 is deposited on the stacked structures 13a, 13b, 13c and the at least one trench t as shown in FIG. 5. Step S109, a high-resistance layer 17 is deposited on the second oxide layer 15. The high-resistance layer 17 comprises a first polycrystalline silicon layer 171 and a first conductive compound layer 173. In this embodiment, the first conductive compound layer 173 is formed on the first polycrystalline silicon layer 171.

Step S111, a low-resistance layer 19 is deposited on the high-resistance layer 17. The low-resistance layer 19 comprises a second polycrystalline silicon layer 191 and a second conductive compound layer 193. In this embodiment, the second conductive compound layer 193 is formed on the second polycrystalline silicon layer 191.

In this embodiment, a thickness of the second polycrystalline silicon layer 191 is greater than a thickness of the first polycrystalline silicon layer 171, and a thickness of the second conductive compound layer 193 is greater than a thickness of the first conductive compound layer 173. Specifically, a resistance of the high-resistance layer 17 is higher than a resistance of the low-resistance layer 19. Through the arrangement of the stacked structures 13a, 13b, 13c, the second oxide layer 15, the high-resistance layer 17, and the low-resistance layer 19, the quality and stability of the three-dimensional semiconductor diode device 1 can be greatly improved.

In one embodiment of the invention, a thickness of the second conductive compound layer 193 is between 20 nm and 50 nm.

In one embodiment of the invention, in step S107, using an atomic layer deposition (ALD) process to deposit the second oxide layer 15, but the invention is not limited thereto.

As shown in FIG. 5, after depositing the low-resistance layer 19 in step S111, there is still a trench t1 in the at least one trench t, but the invention is not limited thereto. In other embodiments of the invention, after depositing the low-resistance layer 19, the low-resistance layer 19 is capable of filling up the at least one trench t, that is, the trench t1 as shown in FIG. 5 does not exist.

In one embodiment of the invention, the conductive layer 131 of the stacked structures 13a, 13b, 13c is a P-type semiconductive layer or an N-type semiconductive layer, and the dielectric layer 133 is an oxide layer. For example, the conductive layer 131 of one of the stacked structures 13a is a P-type semiconductive layer or an N-type semiconductive layer, and the dielectric layer 133 is an oxide layer.

In one embodiment of the invention, in step S109 and step S111, an atomic layer deposition (ALD) process is not used when depositing the high-resistance layer 17 and depositing the low-resistance layer 19. Deposition of the high-resistance layer 17 and the low-resistance layer 19 can be implemented by, for example, a low-pressure CVD (LPCVD) process or a metal-organic chemical vapor deposition (MOCVD) process, but the invention is not limited thereto. In one embodiment of the invention, a material of the first conductive compound layer 173 and/or the second conductive compound layer 193 may be BN, BP, BAs, AN, AlP, AlAs, GaN, GaP, GaAs, InN, InP, InAs or a combination of at least two of the foregoing materials.

In one embodiment of the invention, a conductivity of the high-resistance layer 17 is approximately $1e15$ $S \cdot m^{-1}$, and a conductivity of the low-resistance layer 19 is approximately $1e20$ $S \cdot m^{-1}$. A thickness of the high-resistance layer 17 is approximately 20 nm, and a thickness of the low-resistance layer 19 is approximately 30 nm.

As shown in FIG. 4, in one embodiment of the invention, a width w of the at least one trench t is between 45 nm and 65 nm. A thickness of the silicon substrate 111 of the substrate 11 is between 520 nm and 580 nm, and a thickness of the first oxide layer 113 is between 90 nm and 110 nm. Among the stacked structures 13a, 13b, 13c (using the stacked structure 13a as an example for description), a thickness of the dielectric layer 133 is between 18 nm and 22 nm, and a thickness of the conductive layer 131 is between 27 nm and 33 nm.

Figure 6:
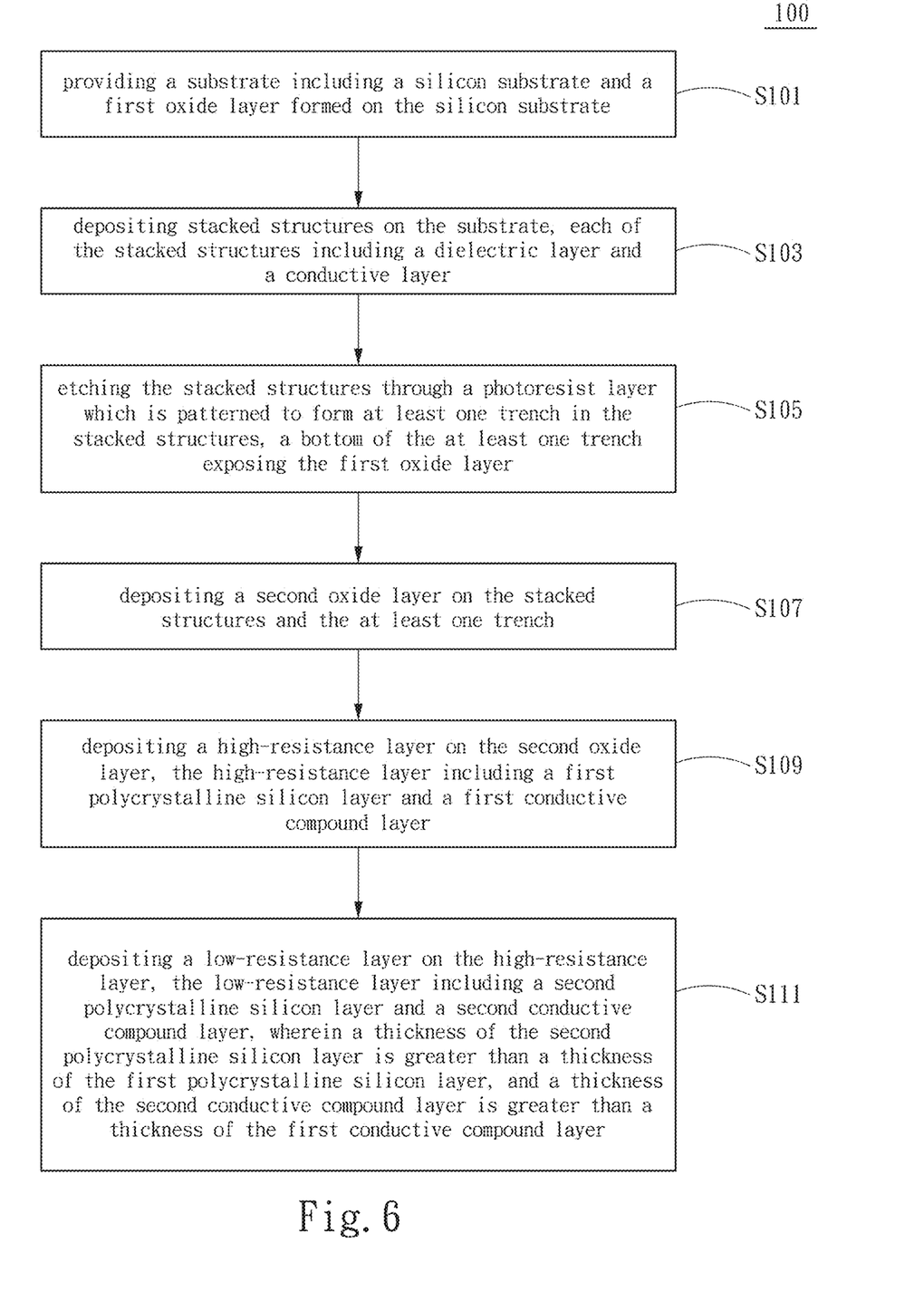
FIG. 6 is a flowchart of a method for manufacturing the three-dimensional semiconductor diode device according to one embodiment of the invention.

Referring to FIG. 6, which is a flowchart of a manufacturing method 100 of the three-dimensional semiconductor diode device 1 as shown in FIG. 5. Implementation details of the step S101, step S103, step S105, step S107, step S109 and step S111 comprised in the manufacturing method 100 are described in detail in the foregoing embodiments and implementation modes, and thus will not be described again.

In summary, the three-dimensional semiconductor diode device and the manufacturing method thereof according to the embodiments of the invention are capable of greatly improving the quality and stability of the three-dimensional semiconductor diode device by disposing the stacked structures, the second oxide layer, the high-resistance layer, and the low-resistance layer.

What is claimed is:

1. A method for manufacturing a three-dimensional semiconductor diode device, comprising:
   providing a substrate, the substrate comprising a silicon substrate and a first oxide layer, the first oxide layer being formed on the silicon substrate;

depositing a plurality of stacked structures on the substrate, each of the stacked structures comprising a dielectric layer and a conductive layer, a number of the stacked structures being greater than twenty, in each of the stacked structures, the dielectric layer being formed on the conductive layer, or the conductive layer being formed on the dielectric layer;

etching the stacked structures through a photoresist layer which is patterned to form at least one trench in the stacked structures, a bottom of the at least one trench exposing the first oxide layer;

depositing a second oxide layer on the stacked structures and the at least one trench;

depositing a high-resistance layer on the second oxide layer, the high-resistance layer comprising a first polycrystalline silicon layer and a first conductive compound layer; and depositing a low-resistance layer on the high-resistance layer, the low-resistance layer comprising a second polycrystalline silicon layer and a second conductive compound layer, wherein a thickness of the second polycrystalline silicon layer is greater than a thickness of the first polycrystalline silicon layer, and a thickness of the second conductive compound layer is greater than a thickness of the first conductive compound layer.

2. The method for manufacturing the three-dimensional semiconductor diode device as claimed in claim 1, wherein an atomic layer deposition process is not adopted when depositing the high-resistance layer and depositing the low-resistance layer.

3. The method for manufacturing the three-dimensional semiconductor diode device as claimed in claim 1, wherein a width of the trench is in a range from 45 nm to 65 nm.

4. The method for manufacturing the three-dimensional semiconductor diode device as claimed in claim 1, wherein a thickness of the silicon substrate is in a range from 520 nm to 580 nm, a thickness of the first oxide layer is in a range from 90 nm to 110 nm, a thickness of the dielectric layer is in a range from 18 nm to 22 nm, and a thickness of the conductive layer is in a range from 27 nm to 33 nm.

5. The method for manufacturing the three-dimensional semiconductor diode device as claimed in claim 1, wherein the conductive layer is a P-type semiconductive layer or an N-type semiconductive layer, and the dielectric layer is an oxide layer.

6. A method for manufacturing a three-dimensional semiconductor diode device, comprising:

providing a substrate, the substrate comprising a silicon substrate and a first oxide layer, the first oxide layer being formed on the silicon substrate;

depositing a plurality of stacked structures on the substrate, each of the stacked structures comprising a dielectric layer and a conductive layer;

etching the stacked structures through a photoresist layer which is patterned to form at least one trench in the stacked structures, a bottom of the at least one trench exposing the first oxide layer;

depositing a second oxide layer on the stacked structures and the at least one trench, wherein an atomic layer deposition process is adopted to deposit the second oxide layer;

depositing a high-resistance layer on the second oxide layer, the high-resistance layer comprising a first polycrystalline silicon layer and a first conductive compound layer; and depositing a low-resistance layer on the high-resistance layer, the low-resistance layer comprising a second polycrystalline silicon layer and a second conductive compound layer, wherein a thickness of the second polycrystalline silicon layer is greater than a thickness of the first polycrystalline silicon layer, and a thickness of the second conductive compound layer is greater than a thickness of the first conductive compound layer.

7. The method for manufacturing the three-dimensional semiconductor diode device as claimed in claim 6, wherein an atomic layer deposition process is not adopted when depositing the high-resistance layer and depositing the low-resistance layer.

8. The method for manufacturing the three-dimensional semiconductor diode device as claimed in claim 6, wherein a width of the trench is in a range from 45 nm to 65 nm.

9. The method for manufacturing the three-dimensional semiconductor diode device as claimed in claim 6, wherein a thickness of the silicon substrate is in a range from 520 nm to 580 nm, a thickness of the first oxide layer is in a range from 90 nm to 110 nm, a thickness of the dielectric layer is in a range from 18 nm to 22 nm, and a thickness of the conductive layer is in a range from 27 nm to 33 nm.

10. The method for manufacturing the three-dimensional semiconductor diode device as claimed in claim 6, wherein the conductive layer is a P-type semiconductive layer or an N-type semiconductive layer, and the dielectric layer is an oxide layer.

11. A method for manufacturing a three-dimensional semiconductor diode device, comprising:

providing a substrate, the substrate comprising a silicon substrate and a first oxide layer, the first oxide layer being formed on the silicon substrate;

depositing a plurality of stacked structures on the substrate, each of the stacked structures comprising a dielectric layer and a conductive layer;

etching the stacked structures through a photoresistive layer which is patterned to form at least one trench in the stacked structures, a bottom of the trench exposing the first oxide layer;

depositing a second oxide layer on the stacked structures and the at least one trench;

depositing a high-resistance layer on the second oxide layer, the high-resistance layer comprising a first polycrystalline silicon layer and a first conductive compound layer; and depositing a low-resistance layer on the high-resistance layer, the low-resistance layer comprising a second polycrystalline silicon layer and a second conductive compound layer, wherein a thickness of the second polycrystalline silicon layer is greater than a thickness of the first polycrystalline silicon layer, a thickness of the second conductive compound layer is greater than a thickness of the first conductive compound layer, wherein a material of the first conductive compound layer and/or the second conductive compound layer comprises BN, BP, BAs, AN, AlP, AlAs, GaN, GaP, GaAs, InN, InP, InAs or a combination of at least two of the foregoing materials.

12. The method for manufacturing the three-dimensional semiconductor diode device as claimed in claim 11, wherein an atomic layer deposition process is not adopted when depositing the high-resistance layer and depositing the low-resistance layer.

13. The method for manufacturing the three-dimensional semiconductor diode device as claimed in claim 11, wherein a width of the trench is in a range from 45 nm to 65 nm.

14. The method for manufacturing the three-dimensional semiconductor diode device as claimed in claim 11, wherein a thickness of the silicon substrate is in a range from 520 nm to 580 nm, a thickness of the first oxide layer is in a range from 90 nm to 110 nm, a thickness of the dielectric layer is in a range from 18 nm to 22 nm, and a thickness of the conductive layer is in a range from 27 nm to 33 nm.

15. The method for manufacturing the three-dimensional semiconductor diode device as claimed in claim 11, wherein the conductive layer is a P-type semiconductive layer or an N-type semiconductive layer, and the dielectric layer is an oxide layer.

* * * * *